(12) United States Patent
Haven et al.

(10) Patent No.: US 11,121,474 B2
(45) Date of Patent: Sep. 14, 2021

(54) ADDITIVE MANUFACTURING TECHNOLOGY (AMT) LOW PROFILE RADIATOR

(71) Applicant: RAYTHEON COMPANY, Waltham, MA (US)

(72) Inventors: John P. Haven, Lowell, MA (US);
Thomas V. Sikina, Acton, MA (US);
Peter J. Adams, Hudson, NH (US);
James E. Benedict, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 132 days.

(21) Appl. No.: 16/180,936

(22) Filed: Nov. 5, 2018

(65) Prior Publication Data

US 2019/0148837 A1 May 16, 2019

Related U.S. Application Data (60) Provisional application No. 62/584,264, filed on Nov. 10, 2017, provisional application No. 62/584,300, filed on Nov. 10, 2017.

(51) Int. Cl.
| | |
|---|---|
| *H01Q 1/24* | (2006.01) |
| *H01Q 21/00* | (2006.01) |
| *H01P 1/04* | (2006.01) |
| *H01Q 13/10* | (2006.01) |
| *H01Q 13/18* | (2006.01) |

(Continued)

(52) U.S. Cl.
CPC ......... *H01Q 21/0087* (2013.01); *H01P 1/047* (2013.01); *H01P 5/028* (2013.01); *H01Q 1/42* (2013.01); *H01Q 1/44* (2013.01); *H01Q 1/523* (2013.01); *H01Q 1/526* (2013.01); *H01Q 13/10* (2013.01); *H01Q 13/106* (2013.01); *H01Q 13/18* (2013.01); *H01Q 17/001* (2013.01); *H01Q 17/008* (2013.01); *H01Q 21/0075* (2013.01); *H05K 1/0219* (2013.01);
(Continued)

(58) Field of Classification Search
None
See application file for complete search history.

(56) References Cited

U.S. PATENT DOCUMENTS

| | | | |
|---|---|---|---|
| 4,647,878 | A | 3/1987 | Landis et al. |
| 4,875,087 | A | 10/1989 | Miyauchi et al. |

(Continued)

FOREIGN PATENT DOCUMENTS

| | | |
|---|---|---|
| CN | 201845850 U | 5/2011 |
| CN | 106936521 A | 7/2017 |

(Continued)

OTHER PUBLICATIONS

Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.

(Continued)

*Primary Examiner* — Trinh V Dinh
(74) *Attorney, Agent, or Firm* — Lando & Anastasi, LLP (57) ABSTRACT

Described herein is a low profile radiator (LPR) manufactured using additive manufacturing technology (AMT). Such an AMT radiator is suitable for use in an array antenna which may be fabricated using AMT manufacturing processes.

6 Claims, 8 Drawing Sheets

(51) Int. Cl.
*H05K 1/02* (2006.01)
*H05K 3/40* (2006.01)
*H01P 5/02* (2006.01)
*H01Q 1/52* (2006.01)
*H01Q 17/00* (2006.01)
*H01Q 1/42* (2006.01)
*H01Q 1/44* (2006.01)
*B33Y 10/00* (2015.01)
*B33Y 70/00* (2020.01)
*B33Y 80/00* (2015.01)

(52) U.S. Cl.
CPC ............ *H05K 3/4038* (2013.01); *B33Y 10/00* (2014.12); *B33Y 70/00* (2014.12); *B33Y 80/00* (2014.12)

(56) References Cited

U.S. PATENT DOCUMENTS

| | | | |
|---|---|---|---|
| 5,401,175 | A | 3/1995 | Guimond et al. |
| 5,426,399 | A | 6/1995 | Matsubayashi et al. |
| 5,828,555 | A | 10/1998 | Itoh |
| 5,857,858 | A | 1/1999 | Gorowitz et al. |
| 6,000,120 | A | 12/1999 | Arledge et al. |
| 6,137,453 | A | 10/2000 | Wang et al. |
| 6,353,189 | B1 | 3/2002 | Shimada et al. |
| 6,400,234 | B1 | 6/2002 | Ohhashi et al. |
| 6,421,018 | B1* | 7/2002 | Zeilinger ............ H01Q 1/1285 343/713 |
| 6,429,819 | B1* | 8/2002 | Bishop ............... H01Q 1/38 343/700 MS |
| 6,486,755 | B2 | 11/2002 | Aruga |
| 6,614,325 | B1 | 9/2003 | Kocin |
| 6,651,322 | B1 | 11/2003 | Currie |
| 6,674,347 | B1 | 1/2004 | Maruhashi et al. |
| 6,747,217 | B1 | 6/2004 | Jochym et al. |
| 6,937,120 | B2 | 8/2005 | Fisher et al. |
| 7,038,622 | B2 | 5/2006 | Schmidt et al. |
| 7,405,477 | B1 | 7/2008 | Tao et al. |
| 7,443,279 | B2 | 10/2008 | Yagisawa et al. |
| 8,749,434 | B2 | 6/2014 | Han et al. |
| 10,505,255 | B2 | 12/2019 | Baheti et al. |
| 2003/0043084 | A1* | 3/2003 | Egashira ............ H01Q 5/378 343/767 |
| 2003/0067410 | A1 | 4/2003 | Puzella et al. |
| 2003/0188889 | A1 | 10/2003 | Straub et al. |
| 2003/0201851 | A1 | 10/2003 | Yoshida et al. |
| 2004/0217823 | A1 | 11/2004 | Tayrani et al. |
| 2006/0033670 | A1* | 2/2006 | Schadler ............ H01Q 9/28 343/767 |
| 2006/0044083 | A1 | 3/2006 | Kuzmenka |
| 2006/0066495 | A1* | 3/2006 | Isoifovich ............ H01Q 13/106 343/770 |
| 2006/0214744 | A1 | 9/2006 | Margomenos |
| 2006/0273864 | A1 | 12/2006 | Zimmerman et al. |
| 2007/0194999 | A1* | 8/2007 | Morton ............... H01Q 5/357 343/767 |
| 2009/0000804 | A1 | 1/2009 | Kobayashi et al. |
| 2009/0009261 | A1 | 1/2009 | Song |
| 2009/0295500 | A1 | 12/2009 | Ives |
| 2010/0182105 | A1 | 7/2010 | Hein et al. |
| 2010/0206617 | A1 | 8/2010 | Johnson et al. |
| 2010/0254094 | A1 | 10/2010 | Ohhira |
| 2011/0193649 | A1* | 8/2011 | Popelka ............ H01P 1/387 333/1.1 |
| 2013/0009729 | A1 | 1/2013 | Kim |
| 2013/0154773 | A1 | 6/2013 | Siprak |
| 2014/0240056 | A1 | 8/2014 | Isom et al. |
| 2015/0189754 | A1 | 7/2015 | Bohra et al. |
| 2015/0323576 | A1 | 11/2015 | Bulja et al. |
| 2016/0079646 | A1 | 3/2016 | Ichige |
| 2016/0172741 | A1 | 6/2016 | Panat et al. |
| 2017/0117620 | A1 | 4/2017 | Lapushin |
| 2018/0086628 | A1 | 3/2018 | Vossough et al. |
| 2018/0323128 | A1 | 11/2018 | Dias et al. |
| 2019/0148807 | A1 | 5/2019 | Sikina et al. |
| 2019/0150271 | A1 | 5/2019 | Azadzoi et al. |
| 2019/0269007 | A1 | 8/2019 | Sikina et al. |
| 2020/0028257 | A1 | 1/2020 | Benedict et al. |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |
| JP | 2004087656 A | 3/2004 |
| JP | 2005236672 A | 9/2005 |
| JP | 2006514483 A | 4/2006 |
| JP | 2007243296 A | 9/2007 |

OTHER PUBLICATIONS

International Search Report in application No. PCT/US2019/019851 dated May 29, 2019.

Jung et al. "Inkjet-printed resistors with a wide resistance range for printed read-only memory applications", Organic Electronics (2013) vol. 14, pp. 699-702.

Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.

International Search Report and Written Opinion in application No. PCT/US2019/019847 dated May 29, 2019.

Kangasvieri et al. "An Ultra-Wideband BGA—Via Transition for High-Speed Digital and Millimeter-Wave Packaging Applications", IEEE (2007), pp. 1637-1640.

International Search Report and Written Opinion in application No. PCT/US2018/059636 dated Mar. 4, 2019.

Farhan Shafique et al. "Laser machining of microvias and trenches for substrate integrated waveguides in LTCC technology", Proceedings of the 39th European Microwave Conference (2009), pp. 272-275.

Deslandes et al. "Integrated Microstrip and Rectangular Waveguide in Planar Form", IEEE Microwave and Wireless Components Letters (2001) vol. 11, No. 2, pp. 68-70.

International Search Report and Written Opinion in application No. PCT/US2018/059625 dated Mar. 4, 2019.

Leib et al. "An ultra-wideband vertical transition from microstrip to stripline in PCB technology", Proceedings of 2010 IEEE International Conference on Ultra-Wideband (2010), p. 1-4.

International Search Report and Written Opinion in application No. PCT/US2018/059240 dated Mar. 4, 2019.

Mukherjee et al. "Broadband Substrate Integrated Waveguide Cavity-Backed Bow-Tie Slot Antenna", IEEE Antennas and Wireless Propagation Letters (2014) vol. 13, p. 1152-1155.

Liu et al. "Broadband Circularly Polarized Antenna With High Gain for Ku-band Applications", IEEE Conference Proceedings (2017), p. 1-2.

Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.

Luo et al. "Antenna Array Elements for Ka-band Satellite Communication on the Move", Loughborough Antennas & Propagation Conference (2013), p. 135-139.

Beeresha et al. "Embedded Microstrip Line to Stripline Vertical Transition Using LTCC Technique", International Journal of Research in Engineering and Technology (2015) vol. 4, Issue 12, pp. 30-34.

Shan et al. "A Compact Broadband Stripline-fed Slot Antenna for Array Application", IEEE International Workshop on Antenna Technology (2005), pp. 555-558.

International Search Report and Written Opinion in application No. PCT/US2018/059602 dated Apr. 18, 2019.

Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.

(56) References Cited

OTHER PUBLICATIONS

Invitation to Pay Additional Fees in application No. PCT/US2018/059410 dated Apr. 23, 2019.
International Search Report and Written Opinion in application No. PCT/US2018/059841 dated Mar. 4, 2019.
Sitaraman et al. "Modeling, Design and Demonstration of Integrated Electromagnetic Shielding for Miniaturized RF SOP Glass Packages", Electronic Components & Technology Conference (2015), p. 1956-1960.

* cited by examiner

ADDITIVE MANUFACTURING TECHNOLOGY (AMT) LOW PROFILE RADIATOR

CROSS-REFERENCE TO RELATED APPLICATIONS

This application claims priority to U.S. Provisional Patent Application No. 62/584,264 filed Nov. 10, 2017, entitled ADDITIVE MANUFACTURING TECHNOLOGY (AMT) LOW PROFILE RADIATOR and to U.S. Provisional Patent Application No. 62/584,300 filed Nov. 10, 2017, entitled LOW PROFILE PHASED ARRAY, which are incorporated by reference herein in their entirety.

GOVERNMENT RIGHTS

Not applicable.

BACKGROUND

As is known in the art, antenna or (radiator) designs commonly employ a standard printed circuit board (PCB) manufacturing process which relies on multiple process steps, expensive materials, and slow cycle turnaround time. Multiple process steps can be a driver for both high cost and slow turnaround time.

Furthermore, antenna assemblies are fabricated generally through a series of processes (e.g., lamination, conductive via backfill) which increases labor cost of manufacturing the overall antenna assembly. In addition to such added labor costs, the use of multiple processes adds cycle time which leads to long build times. Furthermore, if any circuit adjustments are needed, the use of multiple processes may extend any troubleshooting phase. In addition, typical PCB processes do not allow for the small feature sizes necessary to produce a thin array for space based applications.

SUMMARY

Described herein is a radiator having a thickness in the range of about 0.020 inches (20 mils). Such a radiator is referred to as a low profile radiator and is suitable for use in an array antenna comprised of such low profile radiators. The low profile radiator (LPR) design described herein is provided using additive manufacturing technology (AMT) and thus may be referred to as an AMT radiator. Such an AMT radiator is suitable for use in an array antenna which may be fabricated using AMT manufacturing processes.

It has been recognized that radiator designs capable of being manufactured via an AMT approach are significantly lower cost in production, can be rapidly prototyped, and customized to meet design needs. In addition, due to its low profile, the radiator described herein is suitable for use in space-based applications.

Furthermore, the radiator described herein is suitable for use in a foldable array, having a launch volume (i.e., the volume which would be occupied in a launch vehicle) and cost which are reduced compared to a cost and volume required by prior art antennas having the same or similar operating characteristics. The radiator described herein is also capable of deploying in a low earth orbit (LEO) space environment. Thus, radiators of the type described herein are suitable for use in mobile satellite systems (MSS).

Since the radiator design described herein may be manufactured using AMT, the radiator described herein solves problems associated with radiators provided using conventional printed circuit board (PCB) manufacturing techniques. As noted above, the overall thickness of the radiator described herein can be confined to about 20 mils (508 microns) because the milling and printing capabilities of the AMT machines allow for the smaller feature sizes needed for a low profile array. Feature sizes would include, but are not limited to, both the width of transmission lines and the faraday walls (isolation elements) which can be made smaller than with conventional methods.

Furthermore, the radiator described herein utilizes printed conductive "Faraday walls" which are disposed to confine electric fields in desired regions of the radiator. Such Faraday walls can be produced in the same manufacturing step as milling the other features. This saves significant labor costs which drive down the overall cost of the assembly.

The radiator design described herein also utilizes AMT capabilities to print conductive elements of virtually any shape and size, within machine constraints. These are used as tuning elements to achieve the desired performance for the low profile array.

Finally, a custom printed connector interface is used so that a standard BMB connector can be used to test the device.

The radiator design described herein is provided from AMT single-step mill and fill operations to produce a radiator having Faraday walls, vertical-launch connections, small (2×2 element) building blocks and milled copper traces.

The AMT antenna is provided having a geometry which is relatively simple compared with geometries of conventional radiators having similar operating characteristics (e.g., operational frequency range, bandwidth, etc.). Furthermore, by using AMT manufacturing techniques, the antenna may include printed tuning elements having a shape and/or size needed to produce double tuned performance.

Furthermore, the antenna design described herein can be integrated into full arrays that can be printed and prototyped in short amount of time.

One aspect of the present disclosure is directed to an antenna element manufactured using additive manufacturing technology (AMT). In one embodiment, the antenna element comprises a substrate having first and second opposing surface with a milled bowtie slot aperture provided in the first surface thereof, and at least one Faraday wall disposed proximate the bowtie slot aperture.

Embodiments of the antenna element further may include the at least one Faraday wall having a first one and a second one of a plurality of Faraday walls. The plurality of Faraday walls may be symmetrically disposed about the aperture with the first one of said plurality of Faraday walls forming a first set of tuning elements symmetrically disposed on either side of said bowtie slot radiator and the second one of said plurality of Faraday walls forming a second set of tuning elements symmetrically disposed on either side of said bowtie slot radiator. The antenna element further may include a feed circuit comprising a vertical launch extending from the first to second surface of said substrate and a feed line disposed across a slot portion of said milled aperture. The feed circuit may be disposed between the first set of tuning elements and the second set of tuning elements.

Another aspect of the disclosure is directed to an antenna assembly comprising a substrate having first and second opposing surface with a milled aperture provided in the first surface thereof, a first set of tuning elements symmetrically disposed on either side of said milled aperture, a second set of tuning elements symmetrically disposed on either side of said of said milled aperture, and a feed circuit comprising a vertical launch extending from the first to second surface of said substrate and a feed line disposed across a slot portion of said milled aperture.

Embodiments further may include an array antenna having a plurality of antenna assemblies. The antenna assembly may include four antenna assemblies arranged such that the first set of tuning elements of a first antenna assembly and a first set of tuning elements of a second antenna assembly are respectively adjacent to a second set of tuning elements of a third antenna assembly and a second set of tuning elements of a fourth antenna assembly.

Yet another aspect of the disclosure is directed to an AMT process for fabricating a bowtie slot antenna. In one embodiment, the method comprises: (a) milling copper from a first surface of a double clad dielectric substrate to form an aperture; (b) milling copper from a second, opposite surface of the double clad dielectric substrate to form a feed line for the aperture; (c) bonding the double clad dielectric substrate to a first surface of a second substrate having a ground plane conductor disposed over a second surface thereof to for a bonded assembly; (d) milling the bonded assembly to form at least one opening for a Faraday wall proximate the aperture; and (e) filling the at least one opening with a conductive liquid to form the Faraday wall.

Embodiments of the method further may include mining the bonded assembly to form at least one opening for a vertical signal path and filling the at least one opening for the vertical signal path. The conductive liquid may be a conductive ink.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. The foregoing features may be more fully understood from the following description of the drawings in which.

DETAILED DESCRIPTION

The concepts, systems and techniques described herein are directed toward a phased array antenna provided using additive manufacturing technology so as to provide the phased array antenna having a low profile (i.e., a thickness in the range of about 15 mils to about 25 mils (referred to herein as a low profile phased array).

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

Figure 1:
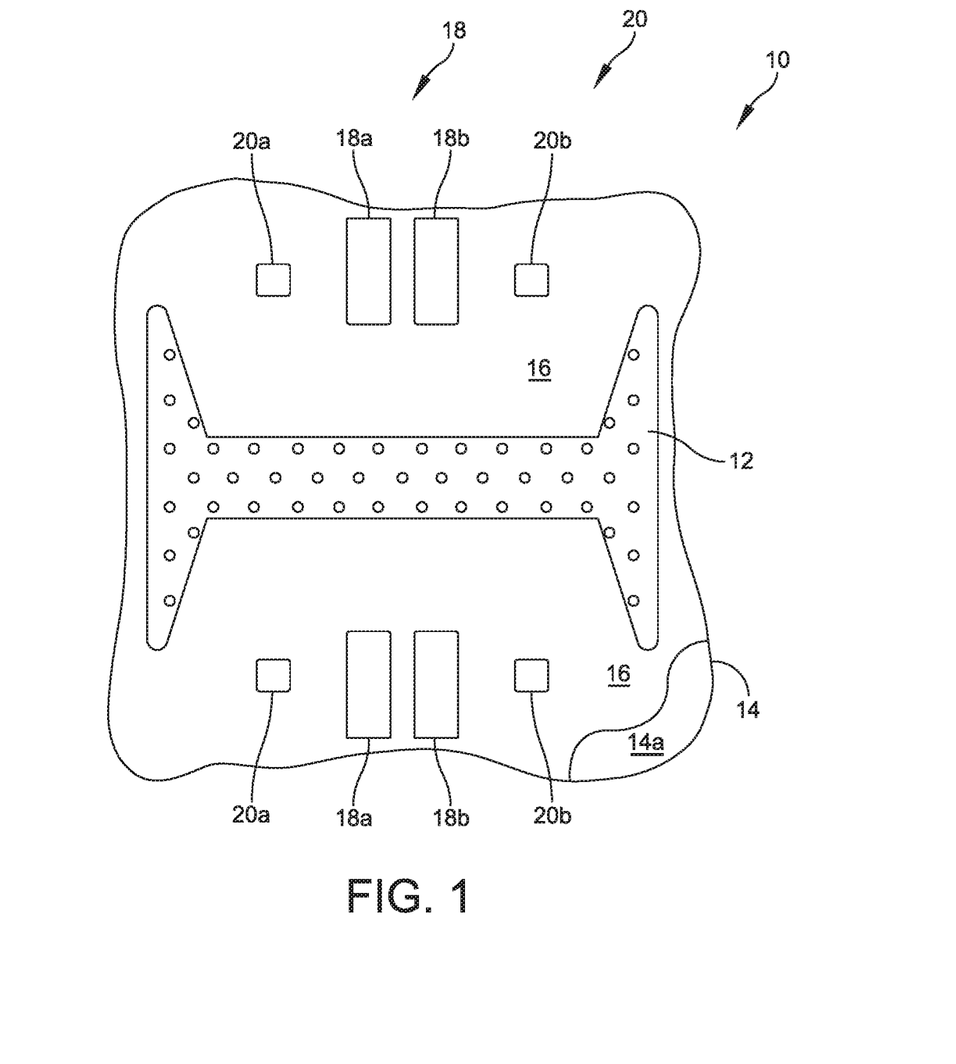
FIG. 1 is a top view of a bowtie radiator manufactured using additive manufacturing technology (AMT)

Referring now to FIG. 1, a radiator 10 manufactured using an additive manufacturing technology (AMT) manufacturing process includes a first dielectric substrate 14 disposed over and bonded (or otherwise coupled) to a second dielectric substrate 15. A first surface 14a of substrate 14 is provided having an electrically conductive material 16 (e.g., copper or an equivalent conductive material) disposed thereover (a portion of conductor 16 has here been removed to reveal a portion of dielectric substrate surface 14a).

An aperture antenna element 12 (or more simply "aperture" 12) having a general "bowtie" shape is milled into a surface 14a of the first dielectric substrate 14. The bowtie shaped aperture 12 is formed by an AMT milling operation which removes the conductive material 16 from substrate surface 14a to form the bowtie shape aperture 12. In some embodiments the conductive material 16 is provided as copper having a thickness of 0.0007 inch (i.e., ½once (oz) copper) is disposed over substrate surface. In one particular embodiment, a central portion of the aperture 12 is provided having a width of about 7 mils (178 microns). The width of aperture 12 is important in that it needs to be selected so as to properly excite the bowtie aperture. The particular aperture width is thus selected in accordance with a variety of factors including, but not limited to, the desired frequency of operation (or frequency bandwidth of operation), the thickness of substrates which provide the radiator and the particular shape of the aperture.

Furthermore, although in this illustrative embodiment conductor 16 is provided as ½ oz copper, it should, of course, be appreciated that in other embodiments, other conductive materials (i.e., conductors other than copper) and other thicknesses (i.e., a conductor having a thickness other than 0.0007 inch) may also be used.

Bowtie radiator 10 further includes first and second sets of tuning elements 18, 20. The first set of tuning elements 18 includes a two pairs of conductors 18a, 18b with each conductor in the pair having a rectangular shape. The second set of tuning elements 20 includes a two pairs of conductors 20a, 20b with each conductor in the pair having a square shape.

In some embodiments, the tuning elements 18a, 18b, 20a, 20b are formed by AMT milling and filling operations. The details of the AMT operations will be described hereinbelow. Suffice it here to say that in the milling operation conductive material 16 as well as substrate material 14 is removed so as to form an opening in the substrate having the desired shape of the tuning element (here, pairs of rectangular and square shapes generally denoted 18, 20, respectively). A conductive ink (or more generally a conductive fluid) is then disposed in the openings to form the tuning elements 18, 20.

With this technique, radiator having a geometry which is relatively simple compared with geometries of prior art radiators having similar operational characteristics (e.g., frequencies of operation, bandwidth characteristics, gain characteristics, etc.) is provided.

The printed tuning elements can be of the shape or size needed to produce double tuned performance. That is, as will be described below in conjunction with FIG. 2, two sets of tuning elements are used to produce a desired field configuration in a unit cell.

Figure 1A:
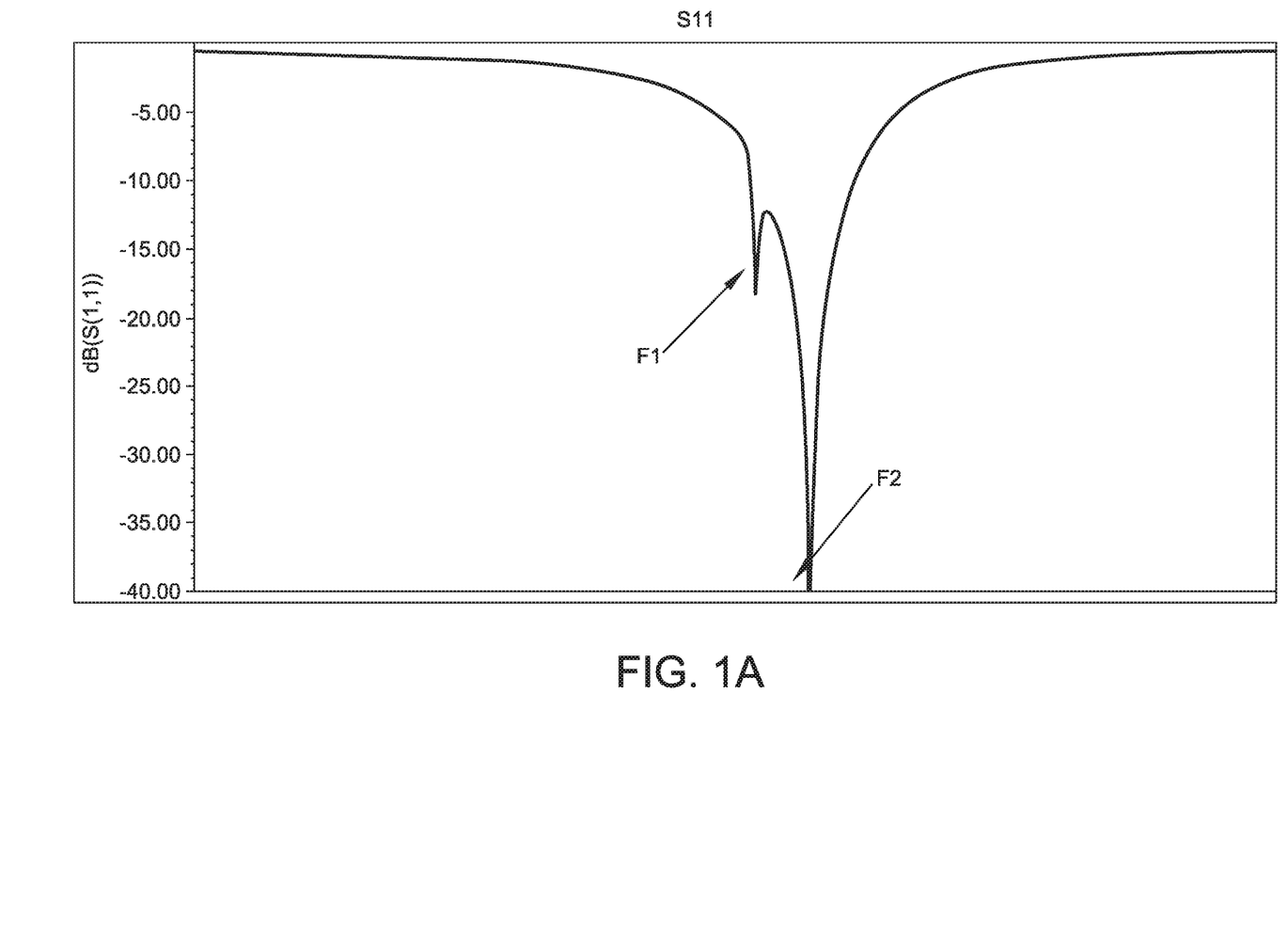
FIG. 1A, is a plot of reflection coefficient (S11) at a radiator input/output port which illustrates a so-called "double tuning" characteristic achieved via tuning elements.

Referring briefly to FIG. 1A, a plot reflection coefficient (S11) at a radiator input/output port illustrates the so-called "double tuning characteristic achieved via tuning elements 18, 20. As can be seen in FIG. 1A, tuning elements 18, 20 can be used to create two resonances at different frequencies F1, F2 which are within a desired operating frequency band of the radiator 10.

Figure 1B:
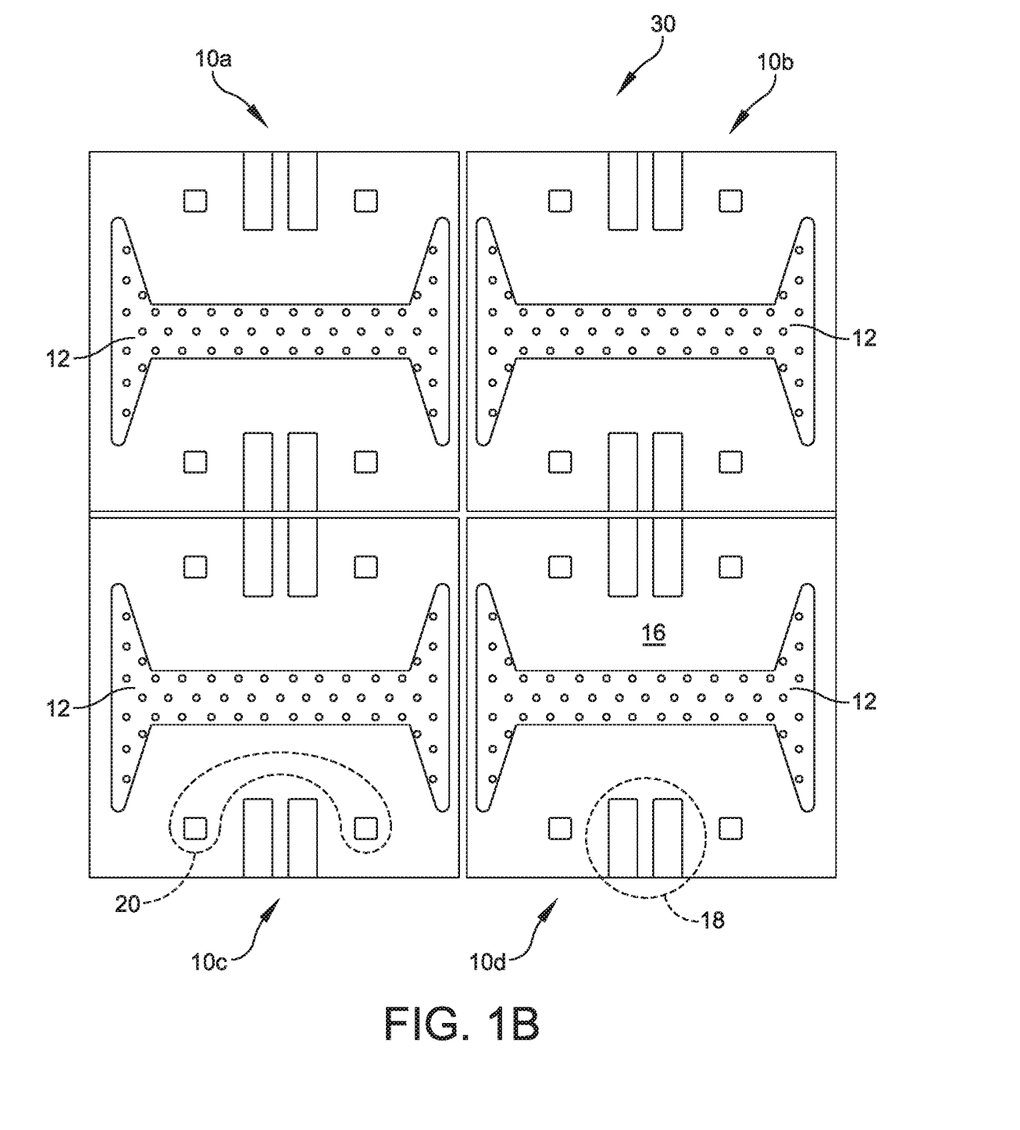
FIG. 1B is a top view of a plurality of bowtie radiators, which may be the same as, or similar to, the bowtie radiator described in FIG. 1, disposed to form a 2×2 array antenna.

Referring now to FIG. 1B, a plurality of, here four, bowtie radiators 10a-10d, are disposed form an array antenna 30. In the illustration of FIG. 1A, the four bowtie radiators 10a-10d are disposed to form a 2×2 array. Those of ordinary skill in the art will appreciate, of course, that an size array or shape array may be formed via the radiators. Array antenna 30 may be used as a building block with which to build relative large array antennas (e.g., array antennas comprising tens, hundreds or thousands of antenna elements depending upon the needs of a particular application). Thus, the radiator design described above in conjunction with FIG. 1 can be integrated into full antenna arrays that can be printed and prototyped in short amount of time.

Figure 2:
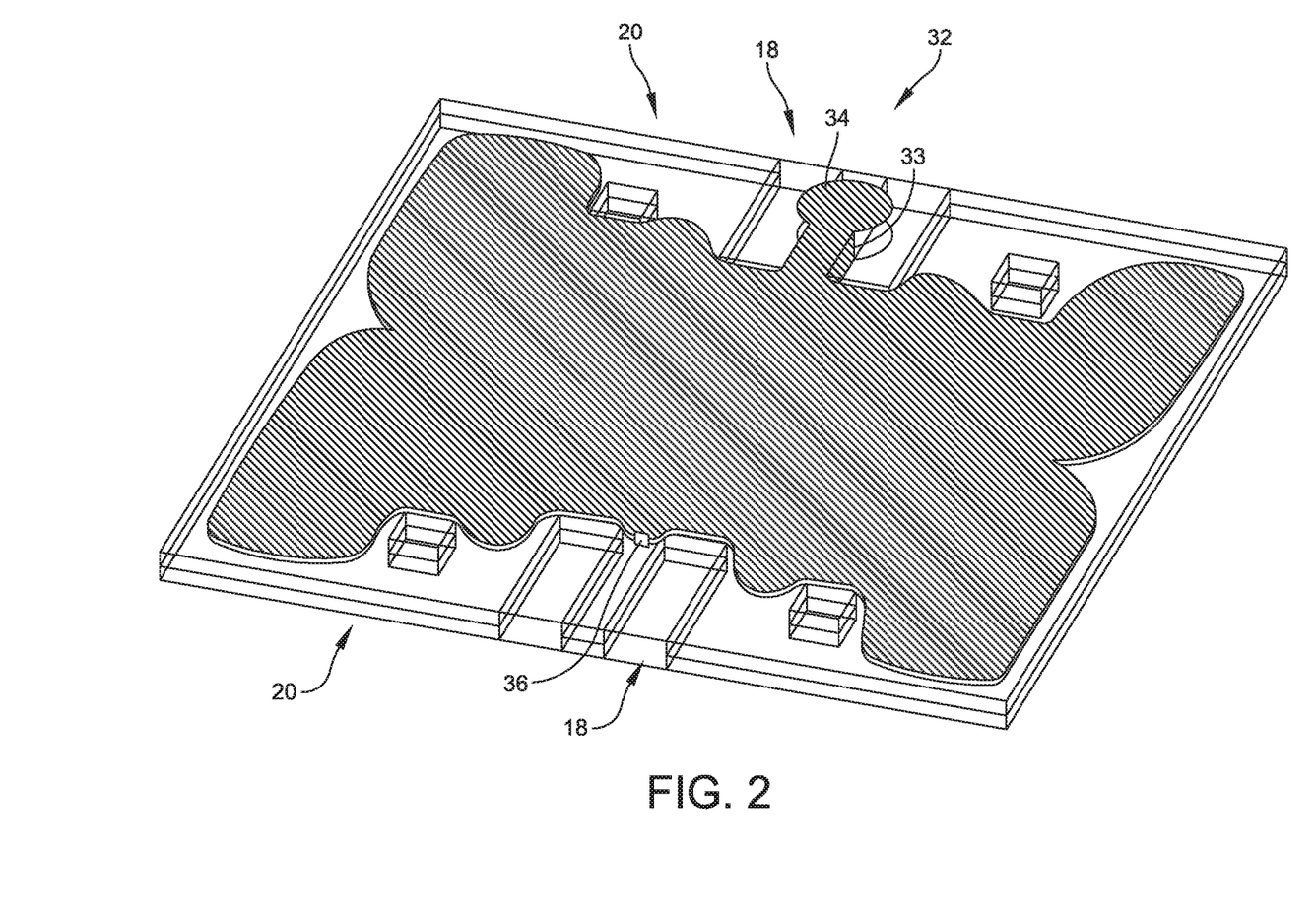
FIG. 2 is a model of a bowtie radiator field configuration achieved through the use of printed reactive tuning elements.

Referring now to FIG. 2, a simulation of an AMT radiator of the type described above in conjunction with FIG. 1 illustrates that printed reactive tuning elements (or tuning posts) 18, 20 produce a desired field configuration within an antenna unit cell. Thus, tuning elements 18, 20 function as so-called Faraday walls so as to control and shape field configurations within an antenna unit cell.

It should be appreciated that the design relies on AMT features. For example, a conductor having a relatively high conductivity (e.g., a conductivity substantially in the range of that of copper) is used in current carrying areas (e.g., transmission lines as compared to Faraday walls).

A feed circuit 32 comprises a printed vertical-launch signal path 33 and a pad 34. Signals are coupled to/from radiator 12 via feed circuit 32.

Figure 3:
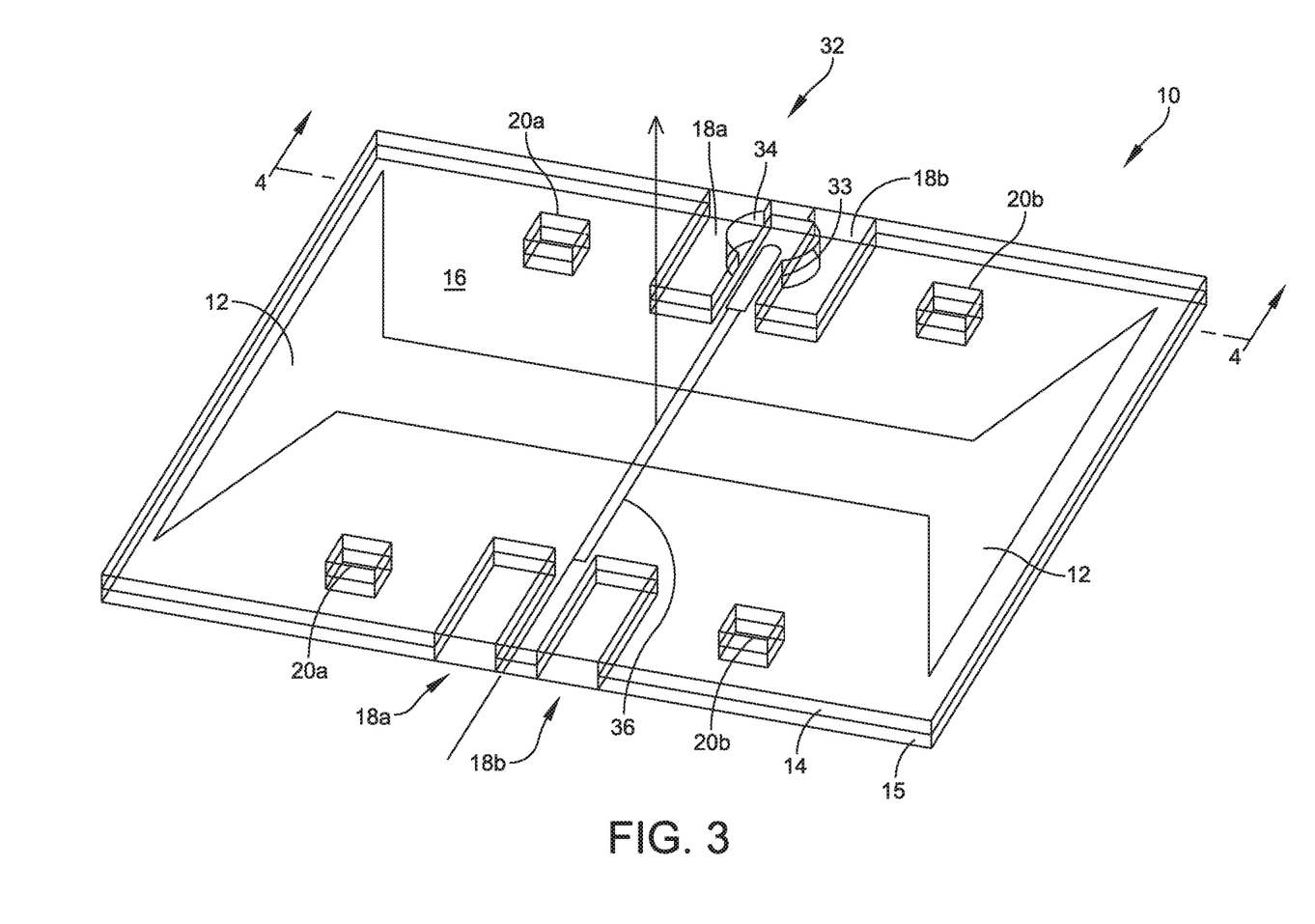
FIG. 3 is an isometric view of a bowtie radiator which may be the same as, or similar to, the bowtie radiator described above in conjunction with FIG. 1.

Referring now to FIG. 3, in which like elements of FIGS. 1 and 2 are provided having like reference designations, a bowtie radiator includes aperture 12, tuning structures 18, 20 and feed circuit 32 comprised of vertical launch structure 33, feed point (or pad) 34 and transmission line feed 36 which crosses bowtie aperture 12. It should be appreciated that transmission line feed 36 is disposed on a surface of substrate 14 opposite the substrate surface on which aperture 12 is disposed. Thus, the voltage on the transmission line feed creates a voltage gradient which excites the aperture from beneath.

In an embodiment, an AMT aperture radiator may be formed as follows. An antenna substrate 14 is provided having a conductor on both sides thereof (i.e., the substrate is provided as a double clad substrate). A milling operation is performed on one side of the substrate (e.g., first surface 14a) in which an aperture (e.g., aperture 12) is formed by removing the conductor (e.g., conductor 16 in FIG. 1) in the desired shape of the aperture. On the second, opposite side of the substrate, all copper is milled away to leave a feedline (e.g., feedline 36 as may be most clearly seen in FIG. 3).

Figure 4:
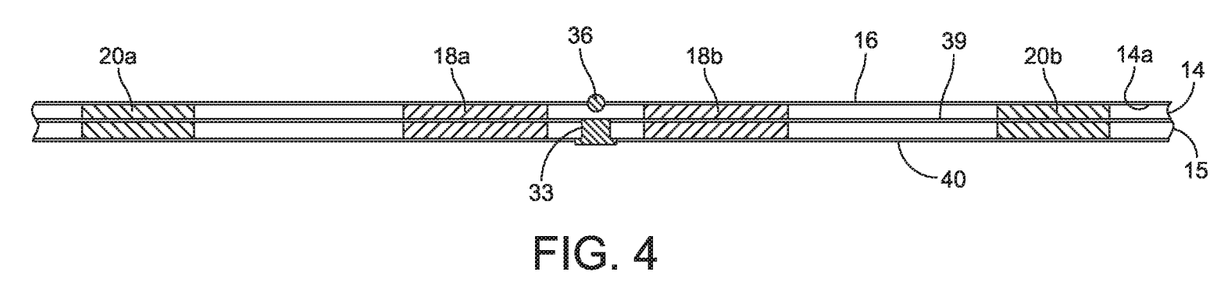
FIG. 4 is a cross-sectional view of the bowtie radiator of FIG. 3 taken across lines 4-4 in FIG. 3.

The antenna substrate is then bonded to a second substrate 15 (sometimes referred to as a ground plane substrate) at 39 to thus form a bonded assembly (as shown in FIG. 4). The second substrate has a conductor (e.g., a ground plane conductor 40) disposed on a surface thereof opposite the feed line.

A milling operation is performed to provide openings for Faraday walls (e.g., tuning elements 18a, 18b, 20a, 20b). Significantly, during the milling operation the substrate and bond materials are removed, but ground plane conductor 40 is left intact. Thus, the milling operation may be performed from the aperture side of the bonded substrates (i.e., the milling is done on the same side of the bonded assembly on which aperture conductor 16 is disposed).

A milling operation is also performed to provide an opening for a vertical launch signal path (e.g., vertical launch 33). The milling for the vertical launch opening is also performed from the aperture side of the bonded substrates (i.e., the milling is done on the same side of the bonded assembly on which aperture conductor 16 is disposed).

A milling operation is also performed to form a pad in ground plane 40 in the region around the vertical launch opening. This milling operation is performed on the ground plane side of the bonded assembly (i.e., the milling is done on the same side of the bonded assembly on which ground plane conductor 40 is disposed).

The openings for the Faraday walls and the vertical launch are then filled with conductive inks to form Faraday walls 18a, 18b, 20a, 20b and vertical launch 33. In another embodiment, a wire conductor may convey a signal "vertically" between layers of the substrate, and may be used to feed a signal to or from various other layers. Such a vertical launch may be formed by machining a hole in one or more of the substrates, applying solder to one or more conductor surfaces, inserting a segment of wire (e.g., copper wire) into the hole, and reflowing the solder to mechanically and electrically secure a connection.

Referring now to FIG. 4 in which like elements of FIG. 3 are provided having like reference designations, the antenna includes a ground plane having a milled bowtie slot radiator provided therein. The bowtie radiator is fed via a transmission line coupled to a vertical launch. The structures are formed in a dielectric substrate having a thickness of about 10 mils. The substrate is provided having a pair of milled and printed Faraday walls formed therein.

Figure 5:
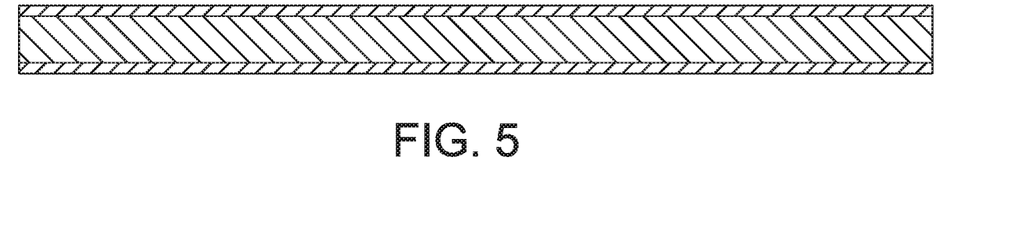
FIGS. 5-5D are a series of diagrams illustrating a process to couple an aperture antenna to a feed line.
Figure 5A:
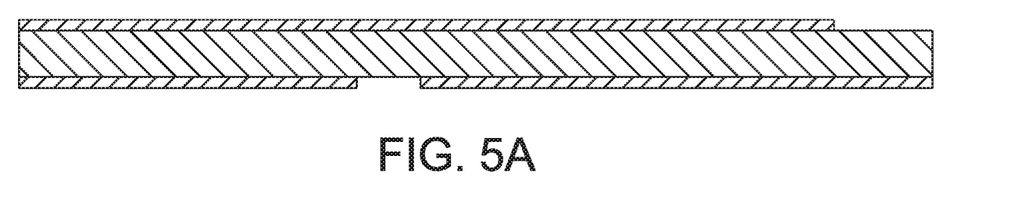
Figure 5B:
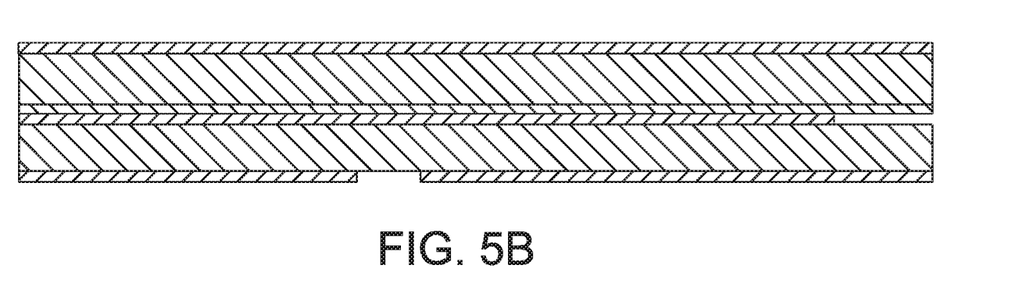
Figure 5C:
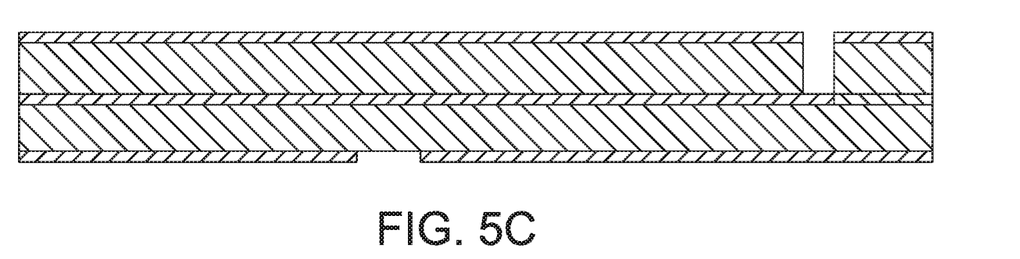
Figure 5D:
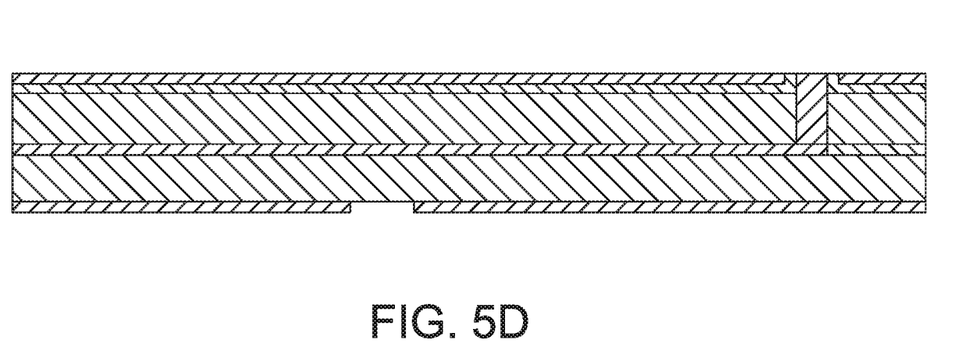

FIGS. 5-5D below, describe structures and techniques to provide a conductive vertical launch that is additive, inexpensive, and removes electro-deposition of copper from the PCB manufacturing process.

Turning now to FIGS. 5-5D, a technique for forming a conductive (e.g., copper) vertical launch (such as vertical launch 33 described above in conjunction with FIGS. 3 and 4) for coupling an AMT aperture antenna (such as aperture antenna 12 described above in conjunction with FIG. 1) to an AMT feed circuit (such as feed circuit 36 described above in conjunction with FIGS. 3 and 4) begins by milling a bottom trace (i.e., feed circuit line 36) into one side of a double cladded dielectric) (FIGS. 5 and 5A). FIG. 5 illustrates a double cladded dielectric substrate (aperture substrate).

FIG. 5A illustrates a mill aperture and feed line formed in the double cladded dielectric substrate.

The antenna substrate is bonded to a ground plane substrate (FIG. 5B).

An opening or cavity leading to the feed line is milled, drilled or otherwise formed (FIG. 5C).

After forming the opening, a solder bump is disposed in the opening again the feed line and a cylinder of copper (or other conductive material) is inserted until it touches the solder bump down below. It has been found that such a copper cylinder can be at least as small as 5 mils in diameter, which is much smaller than a conventional process can create (FIG. 5D).

A soldering iron or other heat source is applied to the top of the piece of inserted copper. Because of the small distance, heat is conducted down the length of the copper which reflows the solder at the feed layer which forms the connection between the inserted piece of copper and the feed line (FIG. 5D).

The Faraday wall is a conductor providing an electromagnetic boundary "vertically" through the substrates. As described herein, the Faraday wall may be formed by machining a trench through the substrates down to a ground plane and filling the trench with a conductive material, such as a conductive ink applied with additive manufacturing techniques. The conductive ink, when set, may form a substantially electrically continuous conductor. The trench in which the Faraday wall is formed does not have to pierce or go through the ground plane. The Faraday wall may therefore be in electrical contact with the ground plane. Additionally, a top of the Faraday wall may be in electrical contact with another ground plane, which may be accomplished by slight over-filling of the machined trench to ensure contact between the conductive ink and the ground plane and/or by application of solder, for example. Positioning of the Faraday wall may be selected for its influence on signal(s) conveyed by the feed circuit. In various embodiments, a Faraday wall may be positioned to provide isolation without regard to influencing a signal in any particular way other than to provide the isolation.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An antenna element manufactured using additive manufacturing technology (AMT), the antenna element comprising:
    a substrate having first and second opposing surface with a bowtie aperture provided in the first surface thereof; and
    a plurality of shielding elements disposed proximate the bowtie slot aperture, the plurality of shielding elements including a first one of a plurality of shielding elements and a second one of a plurality of shielding elements, the plurality of shielding elements being symmetrically disposed about the aperture with the first ones of the plurality of shielding elements forming a first set of tuning elements symmetrically disposed on either side of the bowtie aperture and the second ones of the plurality of shielding elements forming a second set of tuning elements symmetrically disposed on either side of said bowtie aperture.

2. The antenna element of claim 1, further comprising a feed circuit comprising a vertical launch extending from the first to second surface of said substrate and a feed line disposed across a slot portion of said milled aperture.

3. The antenna element of claim 2, wherein the feed circuit is disposed between the first set of tuning elements and the second set of tuning elements.

4. An AMT process for fabricating the antenna element of claim 1, the method comprising:
    (a) milling copper from a first surface of a double clad dielectric substrate to form an aperture;
    (b) milling copper from a second, opposite surface of the double clad dielectric substrate to form a feed line for the aperture;
    (c) bonding the double clad dielectric substrate to a first surface of a second substrate having a ground plane conductor disposed over a second surface thereof to for a bonded assembly;
    (d) milling the bonded assembly to form at least one opening for a shielding element proximate the aperture; and
    (e) filling the at least one opening with a conductive liquid to form the shielding element.

5. The method of claim 4, further comprising milling the bonded assembly to form at least one opening for a vertical signal path and filling the at least one opening for the vertical signal path.

6. The method of claim 5, wherein the conductive liquid is a conductive ink.

* * * * *